United States Patent
Worley

(10) Patent No.: US 7,804,669 B2
(45) Date of Patent: Sep. 28, 2010

(54) STACKED ESD PROTECTION CIRCUIT HAVING REDUCED TRIGGER VOLTAGE

(75) Inventor: Eugene Worley, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 677 days.

(21) Appl. No.: 11/737,537

(22) Filed: Apr. 19, 2007

(65) Prior Publication Data

US 2008/0259511 A1 Oct. 23, 2008

(51) Int. Cl.
 *H02H 3/22* (2006.01)
(52) U.S. Cl. .......................... 361/56; 361/111
(58) Field of Classification Search ................... 361/56, 361/111
See application file for complete search history.

(56) References Cited

U.S. PATENT DOCUMENTS

| | | | | |
|---|---|---|---|---|
| 5,751,525 | A | * | 5/1998 | Olney ........................... 361/56 |
| 6,310,379 | B1 | | 10/2001 | Andresen et al. |
| 6,388,850 | B1 | | 5/2002 | Ker et al. |
| 6,459,553 | B1 | | 10/2002 | Drapkin et al. |
| 6,534,833 | B1 | | 3/2003 | Duvvury et al. |
| 7,027,278 | B1 | * | 4/2006 | Vashchenko et al. ......... 361/56 |
| 7,274,071 | B2 | | 9/2007 | Ando et al. |
| 2005/0083618 | A1 | * | 4/2005 | Steinhoff et al. .............. 361/56 |
| 2008/0029820 | A1 | * | 2/2008 | Disney et al. ................ 257/355 |

OTHER PUBLICATIONS

International Search Report—PCT/US2008/060240, International Search Authority—European Patent Office—Jul. 9, 2008.
Written Opinion—PCT/US2008/060240, International Search Authority—European Patent Office—Jul. 9, 2008.
Chen, Julian Zhiliang, et al., "Design Methodology and Optimization of Gate-Driven NMOS ESD Protection Circuits in Submicron CMOS Processes", IEEE, vol. 45, No. 12, Dec. 1998. pp. 2448-2456.
Quittard, Olivier, et al., "ESD Protection for High-Voltage CMOS Techonologies", EOS/ESD Symposium, 2006, pp. 77-86.

* cited by examiner

*Primary Examiner*—Danny Nguyen
(74) *Attorney, Agent, or Firm*—Jiayu Xu

(57) ABSTRACT

A stacked gate-coupled N-channel field effect transistor (GC-NFET) electrostatic discharge (ESD) protection circuit involves a stack of stages. Each stage has an NFET whose body is coupled to its source. A resistor is coupled between the gate and the source. A current path is provided from a supply voltage node to the gate of each NFET such that during an ESD event, a current will flow across the resistor of the stage and induce triggering. In one embodiment, an NFET stage that is isolated from the supply voltage node by and other stage has an associated capacitance structure. During the transient voltage condition of the ESD event, current flows from the supply voltage node, through the capacitance structure and to the gate, and then through the resistor, thereby initiating triggering. The GCNFET ESD protection circuit has a trigger voltage that is less than twenty percent higher than its holding voltage.

20 Claims, 10 Drawing Sheets

DEEP N-WELL CONNECTED TO SOURCES

CAPACITANCE STRUCTURES ARE HIGH-VOLTAGE DIODES

STACKED ESD PROTECTION CIRCUIT HAVING REDUCED TRIGGER VOLTAGE

BACKGROUND INFORMATION

1. Technical Field

The disclosed embodiments relate to ESD protection circuits.

2. Background Information

An electrostatic discharge (ESD) protection circuit commonly referred to as an active RC triggered clamp can be used to protect functional circuitry from damaging high voltages caused by electrostatic discharge events. If a voltage between two terminals of an integrated circuit increases at an adequate rate due to an ESD event, then an RC circuit triggers and turns on a large N-channel field effect transistor (sometimes referred to as a "bigFET"). The bigFET shunts an ESD current between the two terminals and clamps the voltage across the terminals to a voltage that is safe for the functional circuitry. Although multiple such active RC triggered clamp circuits can be stacked, such active RC triggered clamps are generally used in applications where the supply voltage is relatively low (for example, three volts). If such stacked active RC triggered clamps were to be used in an application having a higher supply voltage of twenty volts for example, then the bigFETs would likely have to be made to be undesirably large because bigFETs in active RC triggered clamps operate in the normal conductive mode.

If an active circuit that operates from a relatively high operating supply voltage is to be protected from ESD events, then a silicon controlled rectifier (SCR) circuit could be used as is known in the art. Unfortunately, SCR ESD protection circuits when activated have holding voltages that can be lower than the relatively high operating supply voltage. This is undesirable. If during normal circuit operation a large voltage transient (that is not due to an ESD event) were to appear across the supply voltage terminals of a circuit protected by an SCR ESD protection circuit, then the SCR ESD protection circuit might engage and pull the supply voltage below the operating voltage of the active circuit. Some means must therefore generally be provided to prevent such large voltage transients from being imposed across the supply voltage terminals. Having to provide this extra circuitry is undesirable.

FIG. 1 (Prior Art) is a circuit diagram of a conventional ESD protection circuit 1 used to protect functional circuitry that operates from the relatively large operating supply voltages described above. ESD clamp circuit 1 is sometimes referred to as a "gate grounded NMOS" (GGMOS or GGNMOS) protection circuit because the gate of each of the N-channel field effect transistors 2-4 is coupled to the source of the transistor. FIG. 2 is a simplified cross-sectional diagram of the circuit of FIG. 1. Under an ESD event, the three transistors 2-4 conduct in the snap-back or parasitic bipolar mode such that an ESD current is conducted from the VCC supply voltage terminal 5, through transistor 2, through transistor 3, though transistor 4, and to ground terminal 6.

FIG. 3 (Prior Art) is a cross-sectional diagram of one of the stages of the GGMOS protection circuit of FIG. 3. Under a high voltage condition, the electric field across the reverse-biased drain 7 to body 8 depletion region increases to the point that an avalanche breakdown mechanism generates change charge carriers. These carriers result in a current flow that flows into the base of a parasitic bipolar NPN transistor 9. The N-type collector of parasitic transistor 9 is the N+ type drain 7. The N-type emitter of parasitic transistor 9 is the N+ type source 10. The P-type base is the P-type material of the body 8 of the N-channel field effect transistor. Parasitic transistor 9 is depicted with the bipolar transistor symbol in FIG. 3. The base current turns on the bipolar transistor, which in turn causes a large collector current to flow across the drain-to-body junction. This current serves to contribute to the necessary base current to sustain forward biasing of the base-to-emitter junction of the parasitic transistor. Accordingly, whereas a higher drain-to-source voltage (called the trigger voltage) is required to initiate bipolar transistor conduction, once initiated the bipolar transistor conduction is sustained unless the drain-to-source voltage drops below a lower voltage (called the holding voltage). This characteristic of transistor turn on and conduction is commonly referred to as "snap-back".

Stacking three such GGMOS circuits such as in the circuit of FIG. 1 multiplies each of trigger voltage and the holding voltage by the number of circuits stacked. The circuit of FIG. 1 therefore has a trigger voltage that is three times the trigger voltage of the single stage circuit of FIG. 3. The circuit of FIG. 1 therefore has a holding voltage that is three times the holding voltage of the single stage circuit of FIG. 3. Unfortunately, the multiplied trigger voltage of the stacked circuit of FIG. 1 may be so high that damage may occur to the functional circuitry to be protected before the ESD protection circuit of FIG. 1 triggers and performs its current shunting function.

FIG. 4 (Prior Art) is a diagram of an ESD protection circuit that has a lower trigger voltage. The ESD protection circuit is sometimes referred to as a gate-driven NMOS (GDNMOS) circuit or a gate-coupled NMOS (GCNMOS) circuit. A resistor 11 is disposed between the gate 12 and the source 13 as illustrated in FIG. 4. The structure has a capacitance 14, such as the inherent drain-to-gate overlap capacitance of the transistor. During an ESD event, a rapid rise in the voltage on drain 24 is coupled to gate 12 by the capacitance 14, and current flow across resistor 11 causes a gate-to-source voltage. This gate-to-source voltage induces a channel to form under the gate 12 and allows an amount of surface current 15 to flow from drain 24. Current 15 serves to reduce the trigger voltage of the circuit. For additional information on this effect, see: 1) "Design Methodology and Optimization of Gate-Driven NMOS ESD Protection Circuits In Submicron CMOS Processes", IEEE Transactions on Electron Devices, vol. 45, no. 12, pages 2448-2456 (December 1998) by Julian Zhiliang Chen et al.; and 2) U.S. Pat. No. 5,982,217; 3) U.S. Pat. No. 5,838,146; and 4) U.S. Pat. No. 5,631,793. Where larger holding and trigger voltages are required than are provided by a single stage, the circuit of FIG. 4 can be stacked. FIG. 5 (Prior Art) illustrates a conventional stacked GCMOS ESD protection circuit having three stages 16-18.

SUMMARY

A stacked gate-coupled N-channel field effect transistor (GCNFET) electrostatic discharge (ESD) protection circuit involves a stack of stages. Each stage has an NFET whose body is coupled to its source. A resistor is coupled between the gate and the source of the NFET. In one example, there are three stages and each stage is isolated in its own deep N-well from the other stages. A current path is provided from a supply voltage node (for example, the supply voltage terminal VCC) to the gate of the NFET in each stage such that during an ESD event, a current will flow across the resistor of the stage and induce triggering of the stage at a reduced trigger voltage. In one embodiment, an NFET stage that is isolated from the supply voltage node by another NFET stage has an associated capacitance structure. The capacitance structure may, for example, be a high voltage diode or a metal-insulator-metal capacitor (MIMCAP), or other suitable structure.

One plate of the capacitance structure is coupled to the voltage supply node, whereas another plate of the capacitance structure is coupled to the gate of the NFET. During the transient condition of the ESD event, current flows from the supply voltage node, through the capacitance structure and to the gate, and then across the resistor. Current flow across the resistor increases the gate-to-source voltage (Vgs) of the NFET and reduces the trigger voltage of the stage. One specific example of the novel stacked GCNFET ESD protection circuit has a holding voltage that is greater than fifteen volts, and also has a trigger voltage that is less then twenty percent higher than the holding voltage. The holding voltage (for example, 20 volts) approximates and is not less than the normal operating supply voltage (for example, 18.0 volts) of a functional circuit being protected by the GCNFET ESD protection circuit. The GCNFET ESD protection circuit and the functional circuit are integrated onto the same integrated circuit.

The foregoing is a summary and thus contains, by necessity, simplifications, generalizations and omissions of detail; consequently, those skilled in the art will appreciate that the summary is illustrative only and does not purport to be limiting. Other aspects, inventive features, and advantages of the devices and/or processes described herein, as defined solely by the claims, will become apparent in the non-limiting detailed description set forth herein.

DETAILED DESCRIPTION

Figure 6:
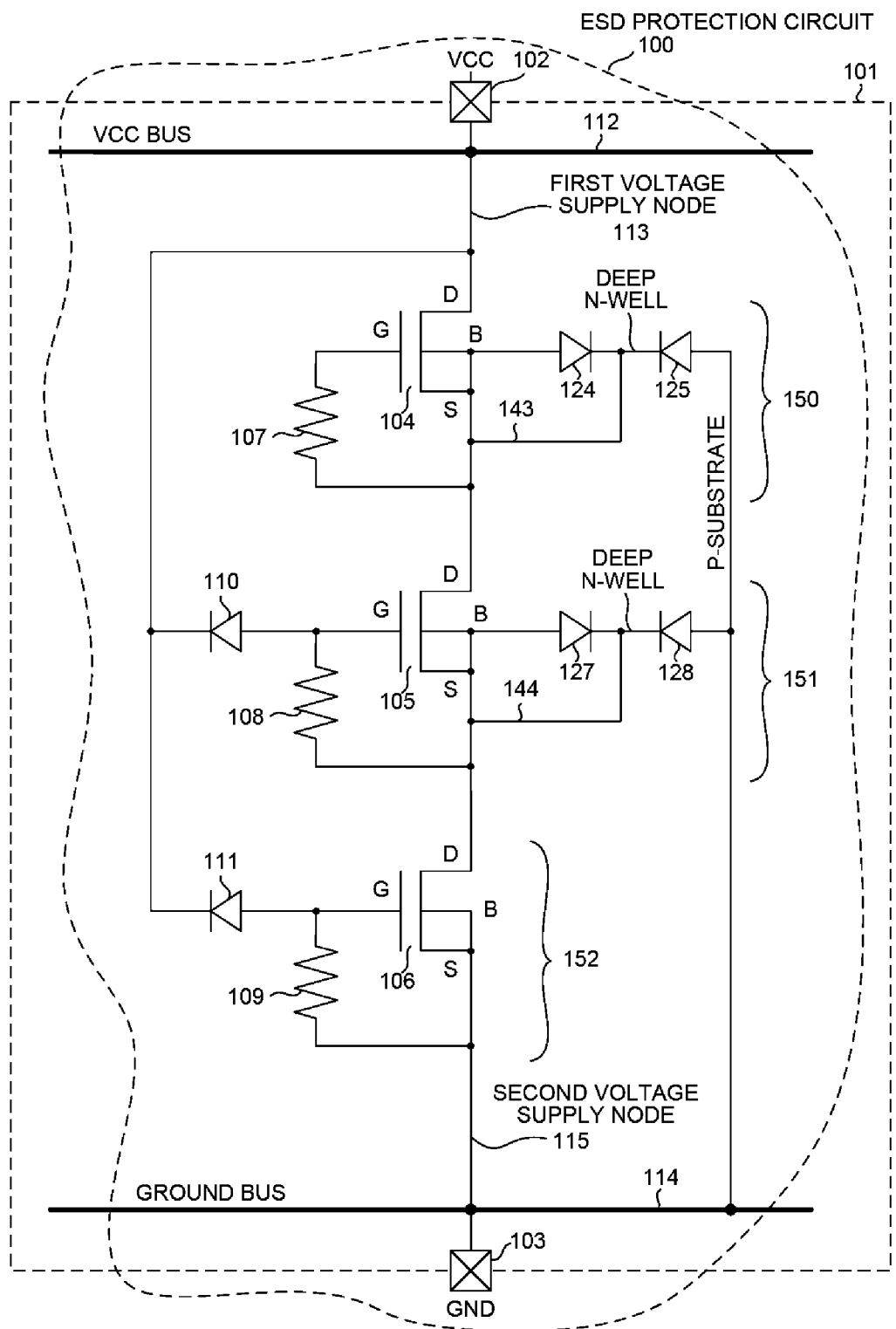
FIG. 6 is a diagram of a stacked GCNFET ESD protection circuit in accordance with one novel aspect.

FIG. 6 is a simplified circuit diagram of a stacked gate-coupled N-channel field effect transistor (GCNFET) electrostatic discharge (ESD) protection circuit 100 in accordance with one novel aspect. GCNFET ESD protection circuit 100 is a part of an integrated circuit 101, and protects other functional circuitry (not shown) that is part of integrated circuit 101. GCNFET ESD protection circuit 100 has three stages 150, 151 and 152. GCNFET ESD protection circuit 100 includes a first supply voltage terminal 102, a second supply voltage terminal 103, a first N-channel field effect transistor (NFET) 104, a second NFET 105, a third NFET 106, a first resistor 107, a second resistor 108, a third resistor 109, a first capacitance structure 110, and a second capacitance structure 111. NFETs 104-106 are six-volt transistors of sizes (W/L=200 microns/0.7 microns) and are made using a triple well process. In the specific circuit of FIG. 6, capacitance structures 110 and 111 are high voltage diodes and have capacitances of 0.1 picofarads. Resistors 107-109 are polysilicon resistors and have a resistance of 100 k ohms each. A first supply voltage bus (VCC bus) 112 of integrated circuit 101 is equipotential node 113. Node 113 is coupled to the drain of first NFET 104 and is also coupled to first supply voltage terminal 102. Similarly, a second supply voltage bus (GND bus) 114 of integrated circuit 101 is equipotential node 115. Node 115 is coupled to the source of third NFET 106 and is also coupled to second supply voltage terminal 103. The functional circuitry (not shown) may be powered from the VCC bus 112 which, in the present example, carries eighteen volts under normal operating conditions. In the present example, terminals 102 and 103 are bond pads of integrated circuit 101.

Figure 7:
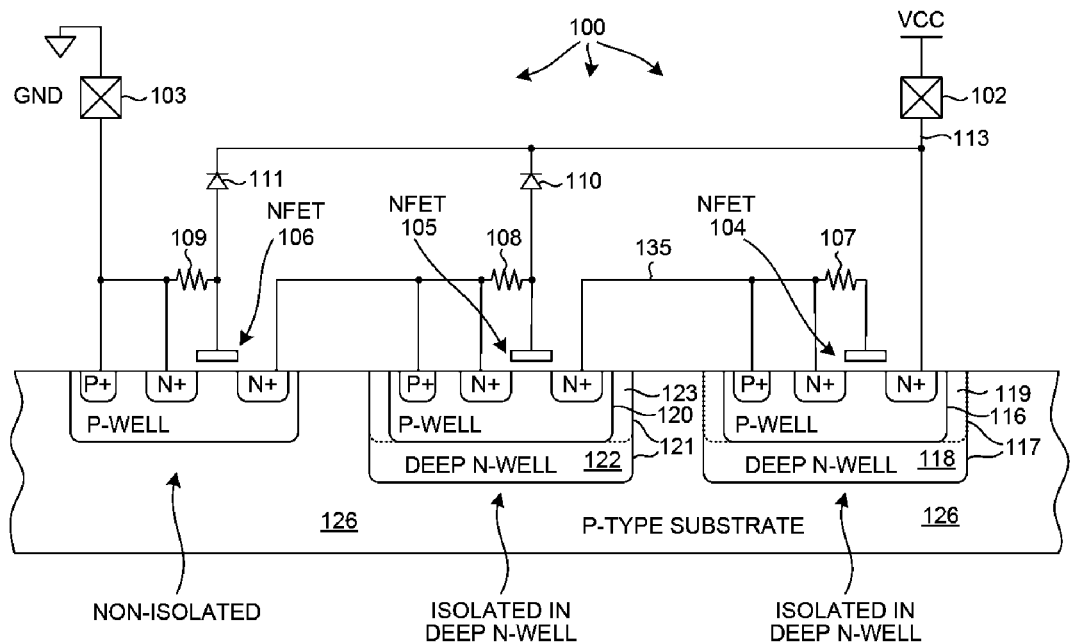
FIG. 7 is a simplified schematic view of the stacked GCNFET ESD protection circuit of FIG. 6.

FIG. 7 is a simplified diagram of the GCNFET ESD protection circuit 100 of FIG. 6. First NFET 104 is disposed in a P-well 116. P-well 116 in turn extends into an N-type well 117. N-type well 117 includes a deep N-well implant portion 118 and a shallower N-well implant portion 119. The P-well is coupled to the source of first NFET 104 as is schematically illustrated in FIG. 7 using a remote P+ contact region. Similarly, second NFET 105 is disposed in a P-well 120 having a remote P+ contact region. P-well 120 in turn extends into an N-type well 121. N-type well 121 includes a deep N-well implant portion 122 and a shallower N-well implant portion 123. The first and second NFETs are therefore isolated in separate N-wells. Third NFET 106 may or may not be isolated from the other two NFETS in its own separate N-well. In the illustrated specific example, third NFET 106 is non-isolated and does not have its own separate N-well.

Diode symbol 124 of FIG. 6 represents the P-well 116 to N-well 117 junction of the isolation structure of first NFET 104. Diode symbol 125 of FIG. 6 represents the N-well 117 to P-type substrate 126 junction. Line 143 indicates that the deep N-well of NFET 104 is connected to the source of NFET 104. Diode symbol 127 of FIG. 6 represents the P-well 120 to N-well 121 junction of the isolation structure of second NFET 105. Diode symbol 128 of FIG. 6 represents the N-well 121 to P-type substrate 126 junction. Line 144 indicates that the deep N-well of NFET 105 is connected to the source of NFET 105.

Figure 8:
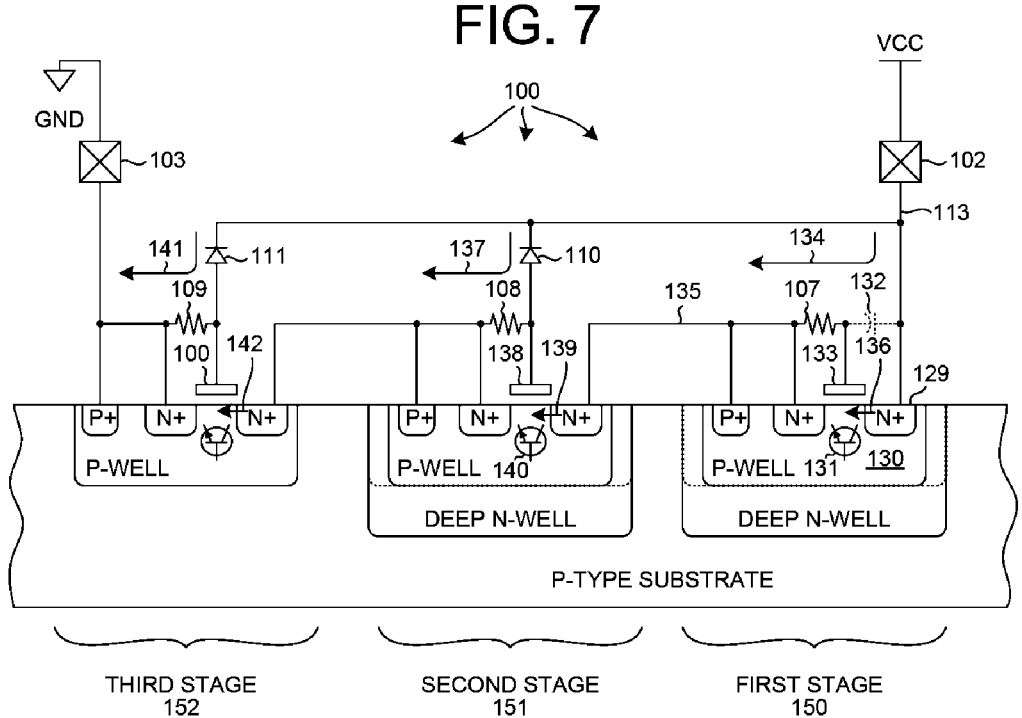
FIG. 8 is a diagram that illustrates an operation of the stacked GCNFET ESD protection circuit of FIG. 6.

FIG. 8 illustrates an operation of the GCNFET ESD protection circuit 100 of FIG. 7. Capacitor symbol 132 represents a drain-to-gate overlap capacitance of first NFET 104. During an ESD condition when the voltage between VCC terminal 102 and GND terminal 103 rises quickly, the reverse-biased drain region 129 to body region 130 depletion region grows and the electric field across the depletion region increases.

Capacitance 132 couples node 113 to the gate 133 of NFET 104. Before enough leakage current flows across the drain-to-body depletion region to turn on parasitic NPN bipolar transistor 131, a current 134 flows in a first current path from node 113, through capacitance 132, and through resistor 107 to node 135. The first current path actually extends farther from node 135 to second terminal 103. All gate-to-source voltages are pulled up and, hence, all three NFET stages 150-152 are turned on and a drain-to-source current flows in each NFET. Specifically, the first stage to turn on is stage 152, which pulls down the source of NFET 105 of the second stage 151 while the capacitance structure 110 pulls up the gate causing second stage 151 to turn on. Likewise, the source of NFET 104 is pulled down by conductive stages 152 and 151, while the gate-to-drain overlap capacitance of NFET 104 pulls the gate of NFET 104 positive with respect to its source, thereby turning first stage 150 on.

Current 134 (see FIG. 8) flowing in this first current path across resistor 107 increases the gate-to-source voltage of NFET 104. The increased gate-to-source voltage induces a shallow channel to form under gate 130 and allows an amount of current 136 to flow across the depletion region. The current 136 contributes to the seed current required to turn on parasitic NPN bipolar transistor 131. The total seed current therefore involves not just drain-to-body leakage current as would be the case were resistor 107 not present, but rather the total seed current includes a drain-to-body leakage current as well as the MOSFET channel surface current 136. As a consequence of the voltage across resistor 107, parasitic NPN bipolar transistor 131 "triggers" earlier and at a lower node 113 to node 135 voltage than it would had there been no resistor 107. The first stage 150 involving first NFET 104 therefore triggers at approximately 7.5 volts (between nodes 113 and node 135), bipolar transistor 131 turns on and increases the collector current so that the drain current increases. Due to the increased drain current, the drain-to-source voltage across the NFET decreases (or "snaps back") so that the drain-to-source voltage is held at a "holding voltage". The holding voltage of NFET 104 is approximately 6.5 volts. All the current flowing through NFET 104, including the current flowing through the parasitic bipolar transistor of the NFET structure, is said to flow "through" the NFET 104.

The second stage 151 involving NFET 105 operates in much the same way that the first stage 150 operates in that the trigger voltage is reduced by causing a current 137 to flow in a second current path across resistor 108 during the ESD event. This second current flow causes a gate-to-source voltage in second NFET 105, which in turn induces a shallow channel to form under gate 138, thereby allowing a surface current 139 to flow across the drain-to-body depletion region. As in the case of first stage 150, this current 139 contributes to the seed current required to turn on parasitic NPN bipolar transistor 140. In the case of second stage 151, however, the capacitance structure 110 is coupled such that under the AC transient condition of the ESD event, current 137 can flow in the second current path from node 113, through capacitance structure 110, to the gate node of second NFET 105, and then through resistor 108. The second current path actually extends farther from the resistor 108, through stage 152, and to the second terminal 103. Capacitance structure 110 provides the second current path from node 113 to resistor 108.

Third NFET 106 is connected like second NFET 105 is connected, but for the third NFET not being disposed in an isolating deep N-well. Accordingly, the capacitance structure 111 is coupled such that under the AC transient condition of the ESD event, current 141 can flow in a third current path through capacitance structure 111, to the gate node of third NFET 106, and then through resistor 109. Capacitance structure 111 provides the third current path from node 113 to resistor 109. The current flow 141 across resistor 109 causes a gate-to-source voltage on third NFET 106 that causes surface current 142 to flow. The trigger voltage of the third stage 152 is therefore reduced by the same mechanism as the trigger voltage of the second and first stages is reduced. With capacitance structures 110 and 111 in the circuit, the trigger voltage of each stage is approximately 7.5 volts, whereas if the capacitance structures 110 and 111 were not provided then the trigger voltage of each stage would be approximately 11.5 volts.

Figure 1:
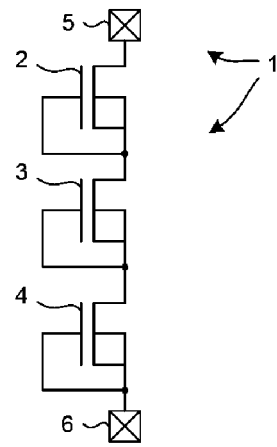
FIGS. 1 and 2 (Prior Art) are diagrams of a conventional ESD protection circuit sometimes referred to as a "gate grounded NMOS" (GGMOS) ESD protection circuit.
Figure 2:
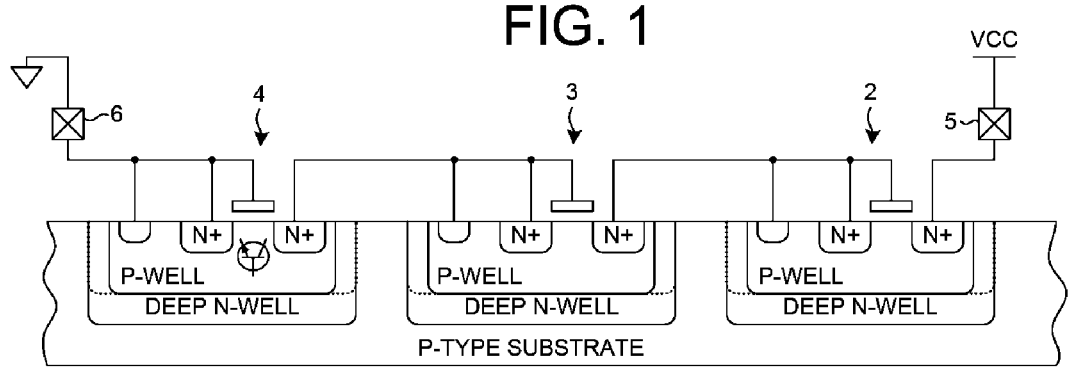
Figure 3:
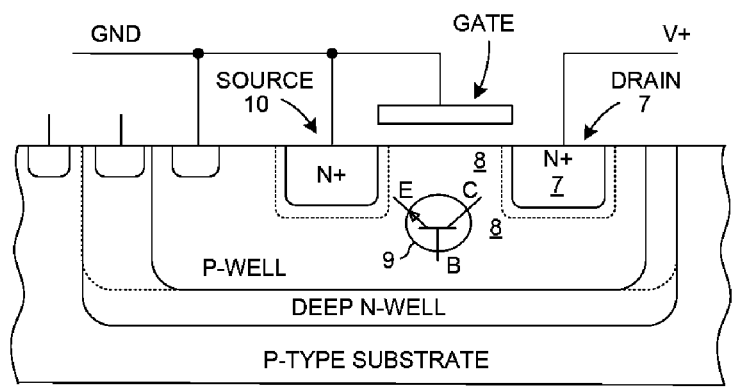
FIG. 3 (Prior Art) illustrates a portion of the GGMOS circuit of FIG. 1.
Figure 4:
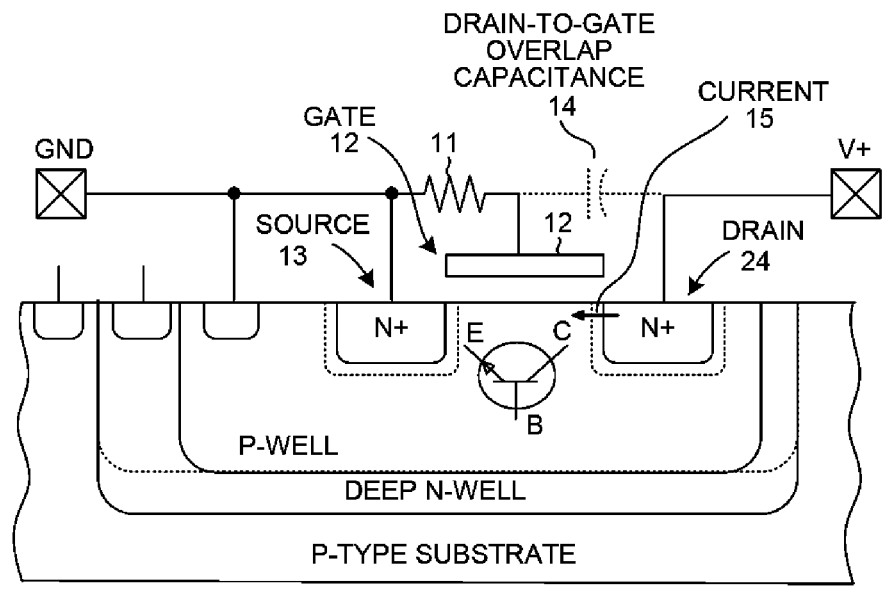
FIG. 4 (Prior Art) is a diagram of an ESD protection circuit sometimes referred to as a gate-driven NMOS (GDNMOS) circuit or a gate-coupled NMOS (GCNMOS) circuit.
Figure 5:
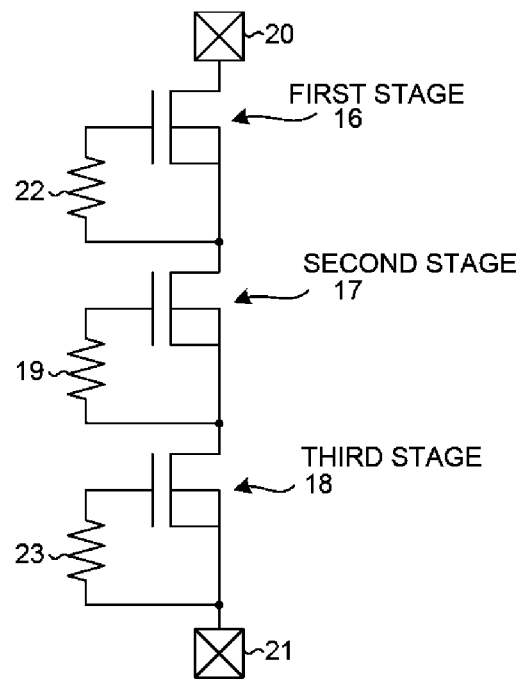
FIG. 5 (Prior Art) illustrates a prior art stacked ESD protection circuit having three stages.

In the conventional circuit of FIG. 5 (Prior Art), in contrast, there is no substantial current path for a current to flow during the ESD event across resistor 19. In the conventional circuit of FIG. 5, before first stage 16 has been triggered there is no way for current from terminal 20 to pass through first stage 16 and to the drain of the NFET of second stage 17. Therefore, despite the existence of resistor 19, there is no substantial current flow across resistor 19 and a gate-to-source voltage is not developed in second stage 17 adequate to cause the second stage to trigger at a reduced trigger voltage by the introduction of a current such as current 15 in FIG. 4. Third stage 18 is connected in the same way that second stage 17 is connected. The trigger voltage of third stage 18 is therefore similarly not reduced by the introduction of a current such as current 15 in FIG. 4. Moreover, prior to the triggering of second and third stages 17 and 18, the source of the NFET of the first stage 16 is isolated from the ground terminal 21. Accordingly, there is also no substantial current flow across resistor 22 of the first stage 16 to ground terminal 21. Therefore, despite the existence of resistor 22 in the first stage 16, the trigger voltage of first stage 16 is also not reduced by the introduction of a current such as current 15 in FIG. 4. The resistors 22, 19 and 23 have little or no effect on the trigger voltage of the circuit of FIG. 5.

Figure 9:
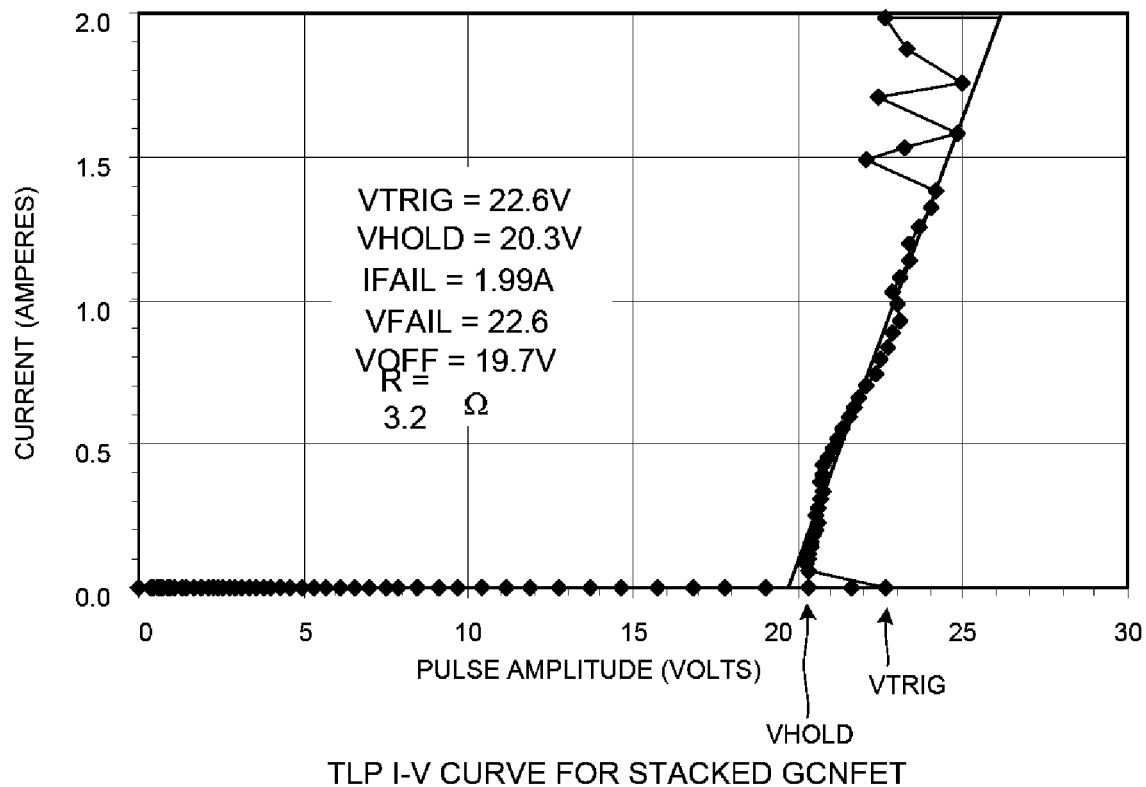
FIG. 9 is a TLP I-V curve for the stacked GCNFET ESD protection circuit of FIG. 6.

FIG. 9 is a TLP (transmission line pulse) I-V curve for stacked GCNFET ESD protection circuit 100 of FIG. 6. Each measurement in FIG. 9 is for a one hundred nanosecond pulse supplied onto terminal 102. The voltage magnitude of the pulse determines the placement of the measurement mark along the horizontal axis. The current flowing through ESD protection circuit 100 is averaged between seventy nanoseconds and ninety nanoseconds after the start of the pulse determines the placement of the measurement mark along the vertical axis. The TLP I-V curve indicates that ESD protection circuit 100 has a trigger voltage VTRIG of 22.6 volts, as compared to a trigger voltage of approximately 34.5 volts that would be the trigger voltage were capacitance structures 110 and 111 not provided. The TLP I-V curve indicates that ESD protection circuit 100 has a holding voltage VHOLD of 20.3 volts. The VCC supply voltage in this example has a maximum value of 18.0 volts. The 20.3 volt holding voltage approximates but is not less than or equal to the normal VCC supply voltage, and the 22.6 volt trigger voltage is a relatively small but a comfortable margin (about four volts) above the normal VCC operating supply voltage. Advantageously, GCNFET ESD protection circuit 100 shunts ESD current such that the trigger voltage is less than twenty percent higher than the holding voltage, and the holding voltage is greater than fifteen volts.

Figure 10:
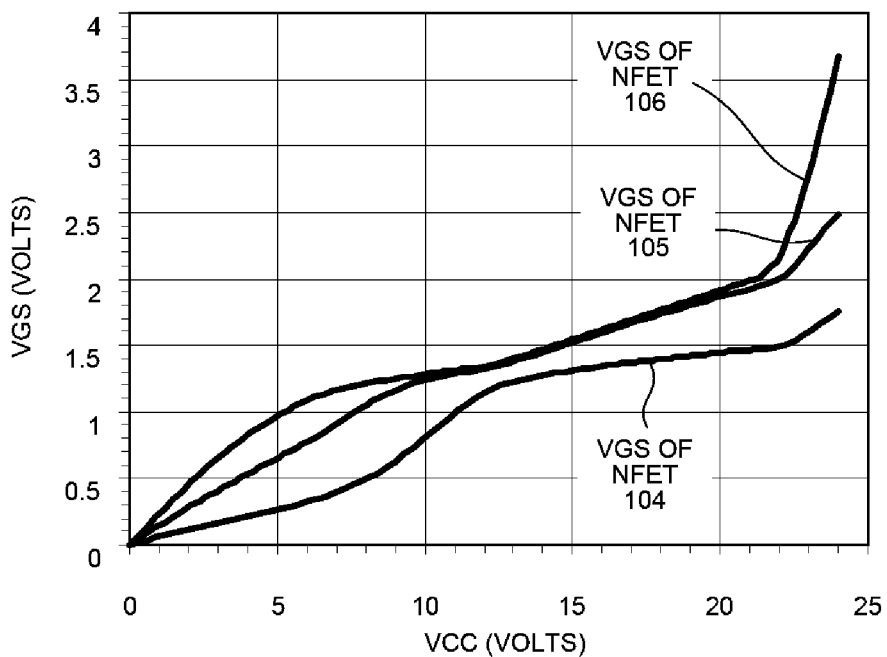
FIG. 10 is a graph showing gate-to-source voltage (Vgs) curves for the NFETs in the stacked GCNFET ESD protection circuit of FIG. 6.

FIG. 10 is a diagram that shows gate-to-source voltage (Vgs) curves for the three NFETs 104-106 of FIG. 6. Note that at the 20.3 holding voltage, the gate-to-source voltages on the first, second and third NFETs 104, 105 and 106, are 1.45 volts, 1.9 volts, and 1.9 volts, respectively. The curves of FIG. 10 are usable to size the capacitances of the capacitance structures 110 and 111, and to size the resistances of the resistors 108 and 109. The upswing in the Vgs curves at about 22 volts is due to capacitance structure 111 reaching its avalanche breakdown voltage in the simulator's diode model. Typically, the gate-to-source voltage for optimum impact ionization is around 1.5 volts to 2.0 volts for the top most NFET 104. The resistors 107-109 are therefore sized large enough that the gate-to-source voltage (Vgs) will 1.5 volts during an ESD event, but are sized small enough that NFETs 104-106 will be turned off during normal circuit operation. The capacitances of the capacitance structures 110 and 111 are sized to allow enough current flow, when terminal 102 is ramped up from zero volts to the holding voltage (20.3 volts) in 100 nanoseconds, to pull the gate-to-source voltages (Vgs) of the first, second and third NFETS 104-106 to the 1.5 volt value. If the capacitance structures 110 and 111 are sized in this way, then the channel currents 136, 139 and 141 will flow through the series connected NFETs 104-106 while the drain field of the NFETs will be at a high value permitting robust impact ionization current to flow into the NFET bodies and, ultimately, triggering of the series-connected NFETs.

Figure 11:
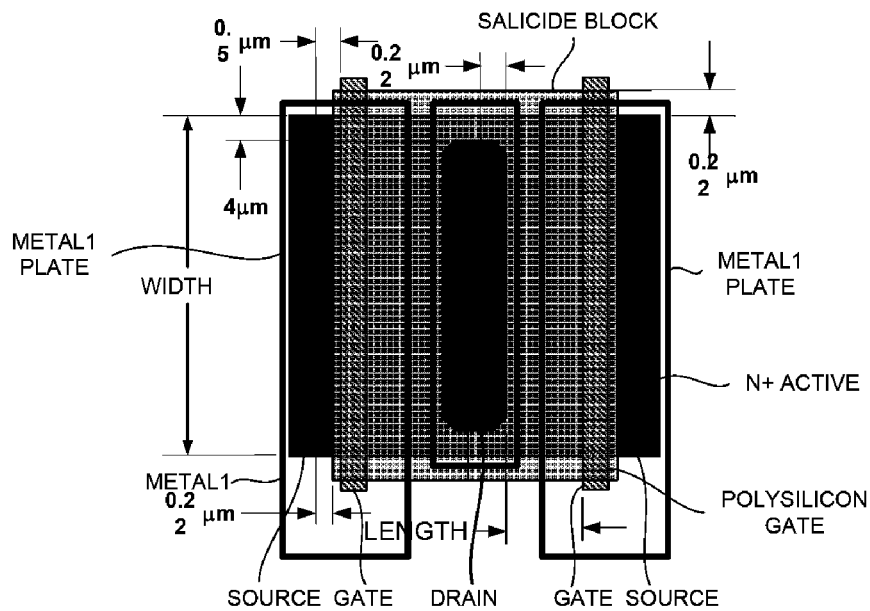
FIG. 11 is a simplified top-down layout diagram of one of the NFETs of the stacked GCNFET ESD protection circuit of FIG. 6.

FIG. 11 is a simplified layout diagram of one of the NFETs 104-106. The area designated N+ active is the N+ diffusion area of the deep N-well. This is a single square region. The P-well within the N-well is not shown but the P-well has a similar, but slightly larger, shape. After these square well regions are formed, a polysilicon layer is deposited over the structure and is patterned to leave to the two parallel extending vertical strips pictured in FIG. 11. Photoresist is then deposited and patterned to create a square of photoresist (called a "salicide block") that is used to "block" a subsequent salicide process. Areas of silicon that are not protected by the block and are not covered with field oxide are salicided to facilitate making good contact to the underlying N+ silicon in the source, gate and drain regions. As illustrated in FIG. 11, most of the surface of the source region is salicided, and a portion of the drain is salicided. Areas extending inward from the gate fingers to the salicided portion of the central drain constitutes an embedded ballasting resistance. Contacts (the columns of small black squares) are made, and then a layer of metal is deposited over the entire structure. The metal layer is patterned to make three plates. In the diagram of FIG. 11, the boundaries of the metal plates are indicated by the heavy three rectangular lines that are labeled "METAL1".

Figure 12:
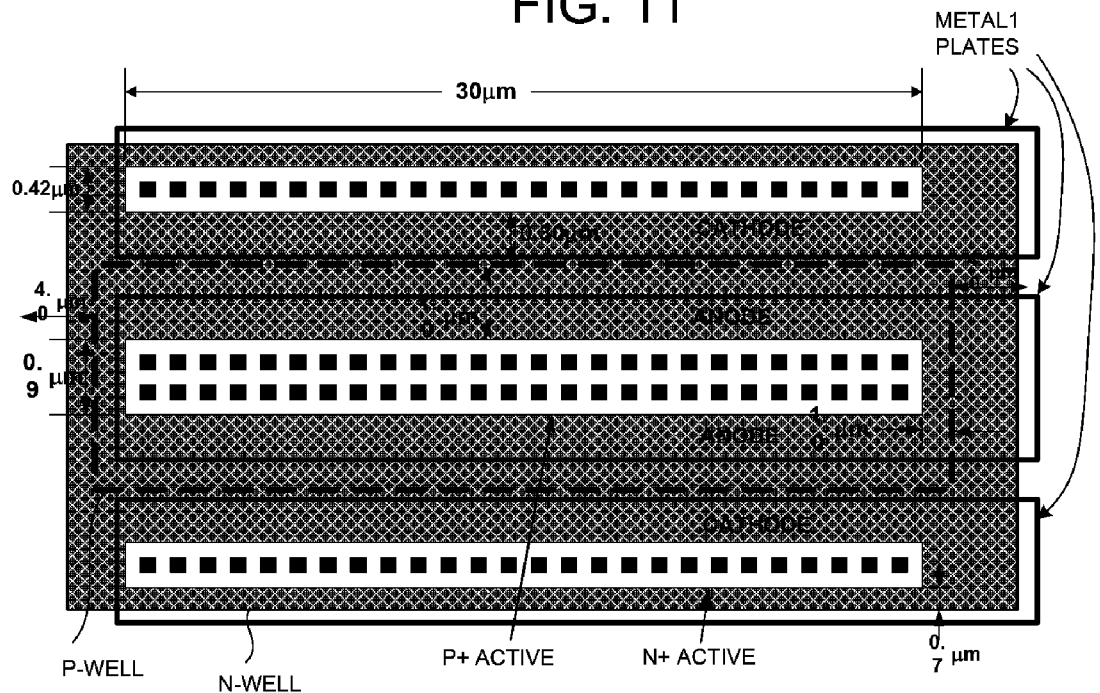
FIG. 12 is a simplified top-down layout diagram of one of the capacitance structures of the stacked GCNFET ESD protection circuit of FIG. 6.

FIG. 12 is a simplified layout diagram of one of the capacitance structures 110-111. In the example of FIG. 12, the capacitance structure is a high-voltage diode. A P-well is formed within an N-well. The boundary of the P-well is indicated by the dashed box in FIG. 12. The junction of the diode is the junction between the P-well (anode) and the N-well (cathode). The contact portions of the cathode are salicided. The anode is referred to as a plate of the capacitance structure, whereas the cathode is referred to as another plate of the capacitance structure.

Figure 13:
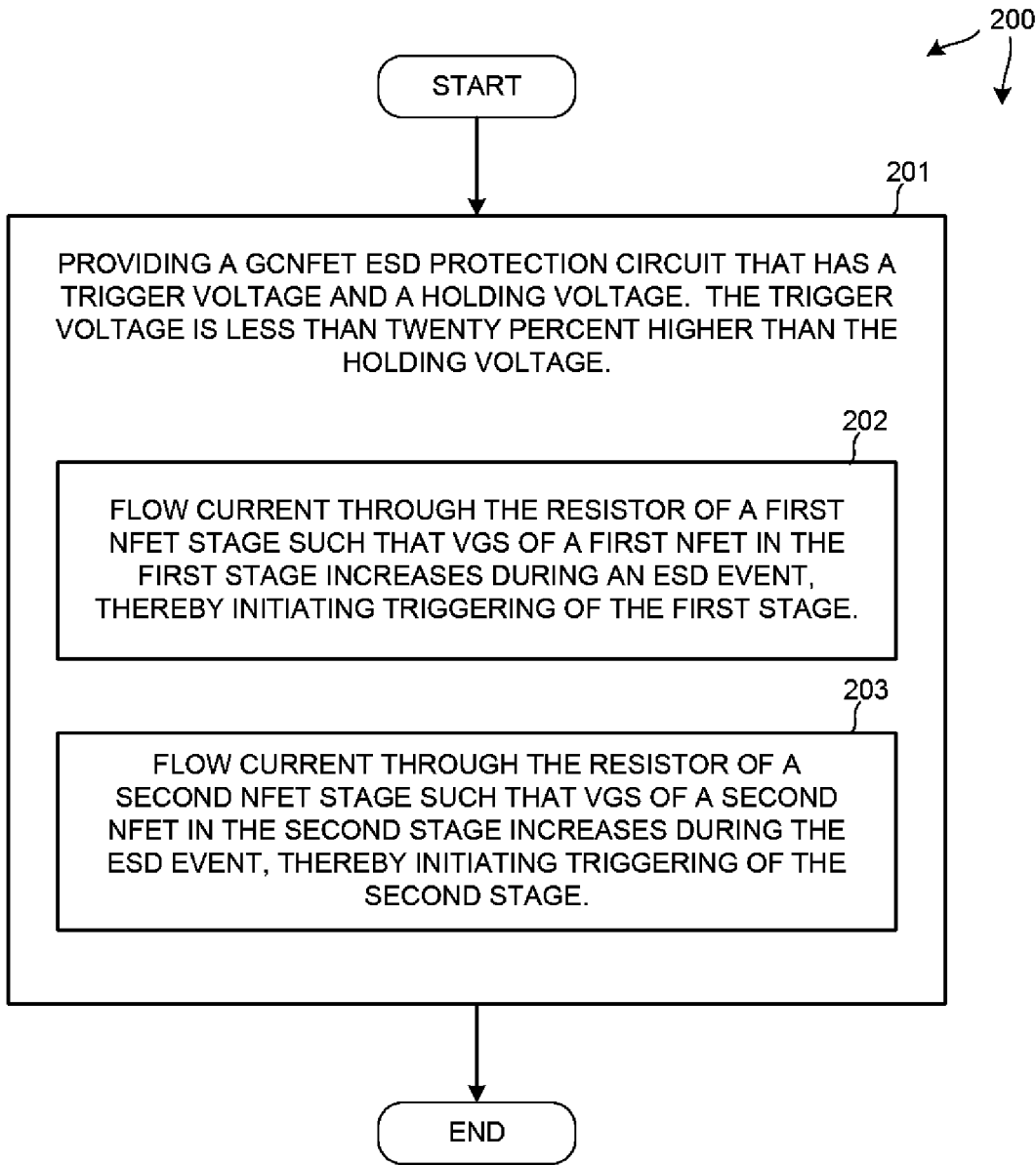
FIG. 13 is a flowchart of a method in accordance with one novel aspect.

FIG. 13 is a simplified flowchart that illustrates a method 200 in accordance with one novel aspect. Method 200 involves a step (step 201) of providing a stacked GCNFET ESD protection device that has a trigger voltage that is less than twenty percent higher than the holding voltage. In one example, this step 201 is accomplished by: 1) Providing a first current path whereby a first current flows (substep 202) during an ESD event across a first resistor. An example of this resistor is resistor 107 of FIG. 6. This current flow across the resistor increases the gate-to-source voltage of the NFET of the first stage, thereby initiating triggering of the first stage. 2) Providing a second current path whereby a second current flows (substep 203) during the ESD event across a second resistor. An example of this resistor is resistor 108 of FIG. 6. This current flow across the resistor increases the gate-to-source voltage of the NFET of the second stage, thereby initiating triggering of the second stage. Each stage of the stacked GCNFET ESD protection circuit 100 is made to trigger at a lower trigger voltage than would be the case were the first and second current paths not provided. By stacking stages, the holding voltage is made to be greater than fifteen volts. The result is that the overall GCNFET ESD protection circuit 100 has a trigger voltage that is less than twenty percent greater than the holding voltage of the circuit, and the holding voltage is greater than fifteen volts.

Figure 14:
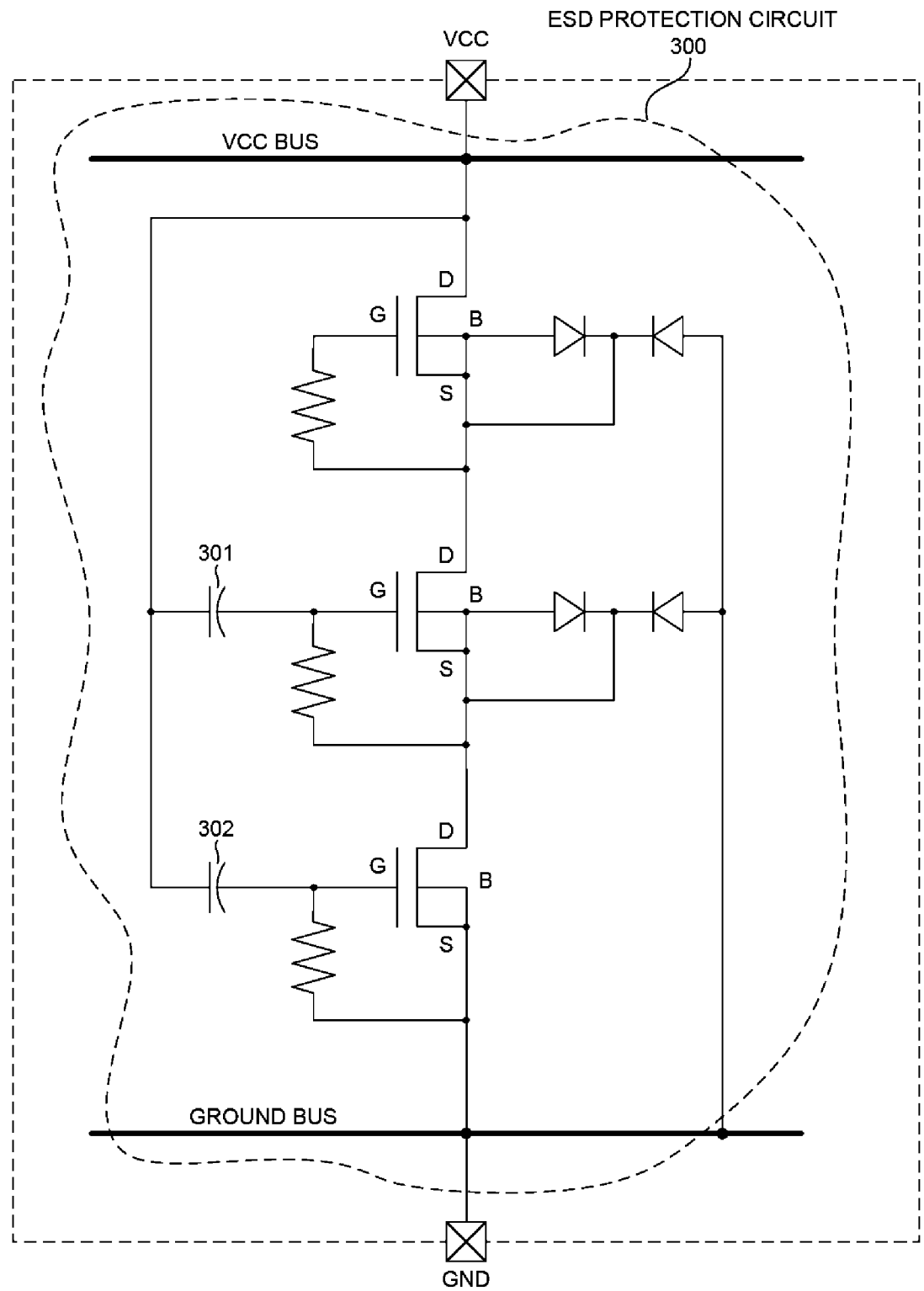
FIG. 14 is a diagram of a second embodiment of a stacked GCNFET ESD protection circuit.

FIG. 14 is a diagram of a second embodiment of a stacked GCNFET ESD protection circuit 300, where the capacitance structures 301 and 302 are dedicated capacitor structures rather than diodes as in the embodiment of FIG. 6. The dedicated capacitor structures may, for example, be lateral metal-insulator-metal capacitors (MIMCAPs) that employ the sidewall capacitance between two parallel-extending pieces of metal in the same layer of metal. The spaces between parallel-extending pieces of metal in the capacitance structure are occupied by a deposited insulator. The capacitor can also be realized by using two adjacent metal layers and thinning of the dielectric between the two metal layers. The thinner inter-level dielectric between the two metal layers is selectively made using a special masking layer.

Figure 15:
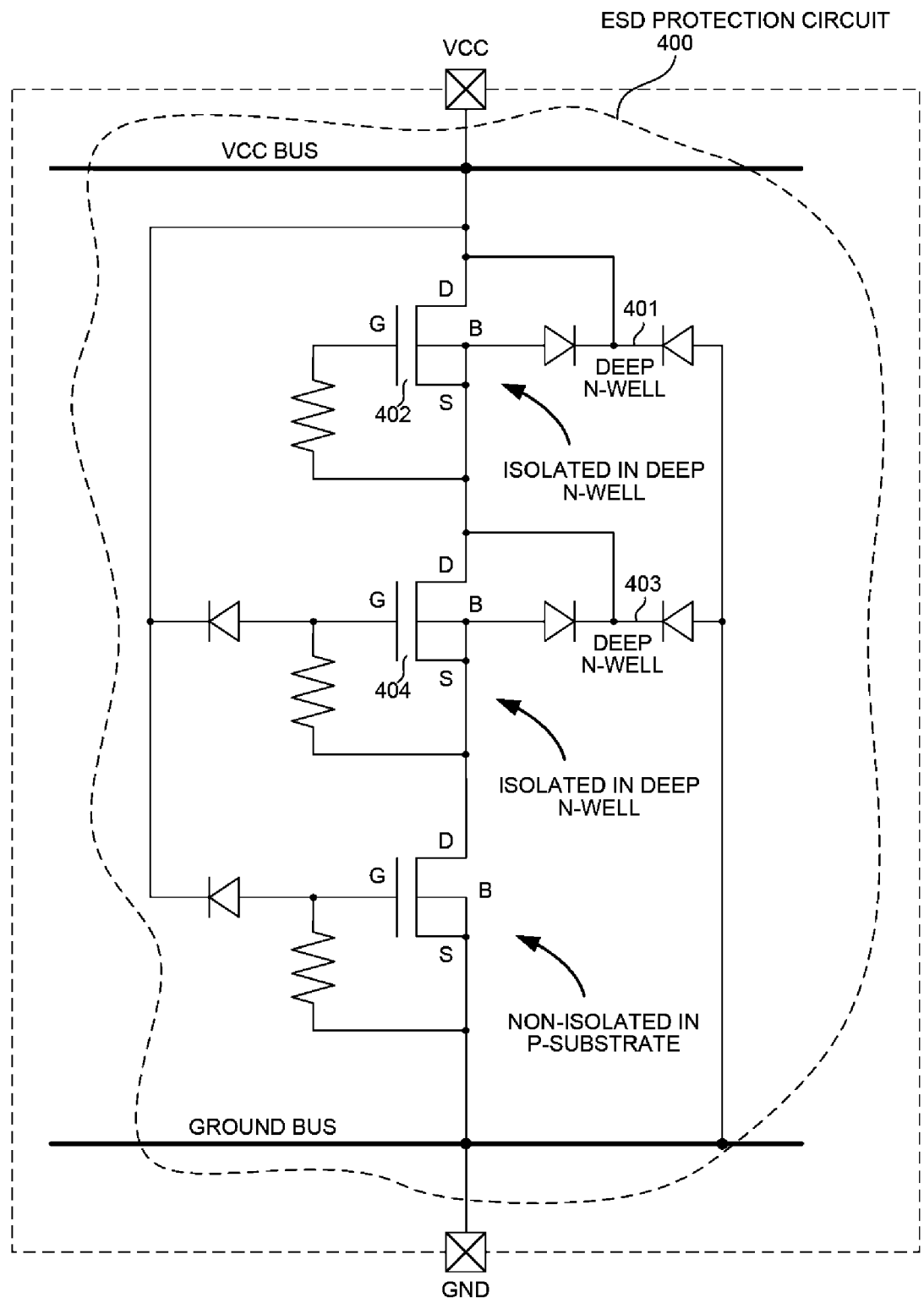
FIG. 15 is a diagram of a third embodiment of a stacked GCNFET ESD protection circuit.

FIG. 15 is a diagram of a third embodiment of a stacked GCNFET ESD protection circuit 400. In this embodiment, the deep N-wells of the first and second NFETs are coupled to the drains of the respective NFETs. The deep N-well 401 of first NFET 402 is coupled to the drain of the first NFET. The deep N-well 403 of second NFET 404 is coupled to the drain of the second NFET. This is different than the circuit of FIG. 6 where the deep N-wells are connected to the sources of the respective NFETs.

Figure 16:
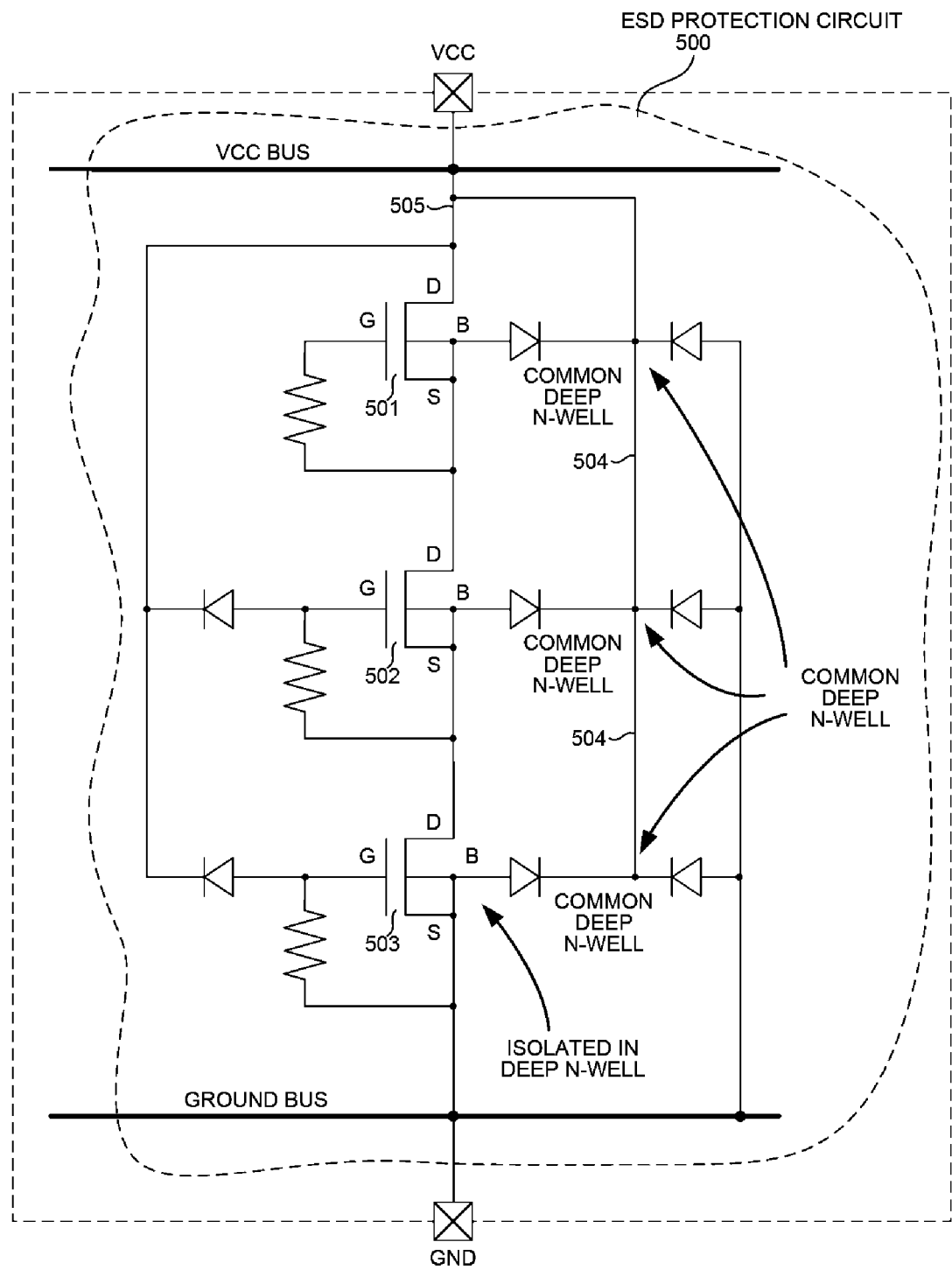
FIG. 16 is a diagram of a fourth embodiment of a stacked GCNFET ESD protection circuit.

FIG. 16 is a diagram of a fourth embodiment of a stacked GCNFET ESD protection circuit 500. In this embodiment, the first, second and third NFETs 501-503 are disposed in one common deep N-well 504. This common N-well 504 is coupled to the first voltage supply node 505.

Although certain specific embodiments are described above for instructional purposes, the teachings of this patent document have general applicability and are not limited to the specific embodiments described above. A stacked GCNFET ESD protection circuit need not have three stages, but rather can have two stages or more than three stages. Accordingly, various modifications, adaptations, and combinations of the various features of the described specific embodiments can be practiced without departing from the scope of the claims that are set forth below.

What is claimed is:
1. A circuit comprising:
a first voltage supply node;
a first N-channel field effect transistor (NFET) having a drain, a gate, a source, and a body, wherein the body is coupled to the source, wherein the drain of the first NFET is coupled to the first supply node;
a first resistor having a first lead and a second lead, wherein the first lead of the first resistor is coupled to the gate of the first NFET, and wherein the second lead of the first resistor is coupled to the source of the first NFET;
a second (NFET) having a drain, a gate, a source, and a body, wherein the body is coupled to the source;
a second resistor having a first lead and a second lead, wherein the first lead of the second resistor is coupled to the gate of the second NFET, and wherein the second lead of the second resistor is coupled to the source of the second NFET; and a first capacitance structure having a first lead and a second lead, wherein the first capacitance structure is taken from the group consisting of: a diode, a metal-insulator-metal capacitor (MIMCAP), a field insulator capacitor, a gate-insulator-semiconductor capacitor, wherein the first lead of the first capacitance structure is coupled to the first voltage supply node, wherein the first capacitance structure is coupled to supply a current that flows through the second resistor during an ESD event.

2. The circuit of claim 1, wherein the second lead of the first capacitance structure is coupled to the first lead of the second resistor.

3. The circuit of claim 1, further comprising:
a second voltage supply node, wherein during the ESD event a current flows in a current path from the first voltage supply node, through the first NFET, through the second NFET, and to the second voltage supply node.

4. The circuit of claim 3, further comprising:
a third NFET having a drain, a gate, a source, and a body, wherein the body is coupled to the source;
a third resistor having a first lead and a second lead, wherein the first lead of the third resistor is coupled to the gate of the third NFET, and wherein the second lead of the third resistor is coupled to the source of the third NFET; and
a second capacitance structure having a first lead and a second lead, wherein the second capacitance structure is taken from the group consisting of: a diode, a metal-insulator-metal capacitor (MIMCAP), a field insulator capacitor, a gate-insulator-semiconductor capacitor, wherein the first lead of the second capacitance structure is coupled to the first voltage supply node, wherein the second lead of the second capacitance structure is coupled to the first lead of the third resistor.

5. The circuit of claim 1, further comprising:
a first N-well;
a first P-well that extends into the first N-well, wherein the body of the first NFET is a part of the first P-well;
a second N-well; and
a second P-well that extends into the second N-well, wherein the body of the second NFET is a part of the second P-well.

6. The circuit of claim 5, wherein the first N-well is coupled to the source of the first NFET, and wherein the second N-well is coupled to the source of the second NFET.

7. The circuit of claim 5, wherein the first N-well is coupled to the drain of the first NFET, and wherein the second N-well is coupled to the drain of the second NFET.

8. The circuit of claim 1, wherein the first N-well is coupled to the first voltage supply node, and wherein the second N-well is coupled to the first N-well.

9. The circuit of claim 1, further comprising:
a common N-well;
a first P-well that extends into the common N-well, wherein the body of the first NFET is a part of the first P-well; and
a second P-well that extends into the common N-well, wherein the body of the second NFET is a part of the second P-well.

10. The circuit of claim 1, wherein the circuit has a trigger voltage, and wherein the circuit has a holding voltage, wherein the holding voltage is greater than fifteen volts, and wherein the trigger voltage is less than twenty percent higher than the holding voltage.

11. A method comprising:
providing a first N-channel field effect transistor (NFET) having a drain, a source, a gate and a body, wherein the body is coupled to the source, wherein a first resistor has a first lead coupled to the gate, and wherein the first resistor has a second lead coupled to the source;
providing a second NFET having a drain, a source, a gate and a body, wherein the body of the second NFET is coupled to the source of the second NFET, wherein a second resistor has a first lead coupled to the gate of the second NFET, wherein the second resistor has a second lead coupled to the source of the second NFET, wherein the drain of the second NFET is coupled to the source of the first NFET;
providing a first current path through the first resistor such that during an ESD event a first current flows across the first resistor in the first current path; and
providing a second current path through the second resistor such that during the ESD event a second current flows across the second resistor in the second current path.

12. The method of claim 11, wherein the first current path extends from a supply voltage node, through a drain-to-gate capacitance, and through the first resistor to the drain of the second NFET, and wherein the second current path extends from the supply voltage node, through a capacitance structure, and through the second resistor.

13. The method of claim 12, wherein the capacitance structure is taken from the group consisting of: a diode, a metal-insulator-metal capacitor (MIMCAP), a field insulator capacitor, a gate-insulator-semiconductor capacitor.

14. A method comprising:
providing a stacked gate-coupled N-channel field effect transistor (GCNFET) electrostatic discharge (ESD) protection circuit, wherein the stacked GCNFET ESD protection circuit has a trigger voltage and a holding voltage, wherein the trigger voltage is less than twenty percent higher than the holding voltage, and wherein the holding voltage is greater than fifteen volts.

15. The method of claim 14, wherein the trigger voltage that is less than twenty percent higher than the holding voltage is achieved at least in part by:
providing a first current path through a first resistor such that during an ESD event a first current flows through the first current path and increases a gate-to-source voltage of a first N-channel field effect transistor (NFET); and
providing a second current path through a second resistor such that during the ESD event a second current flows through the second current path and increases a gate-to-source voltage of a second NFET, wherein a drain of the second NFET is coupled to a source of the first NFET.

16. An integrated circuit comprising:
a first supply voltage node;
a second supply voltage node; and
means for shunting an electrostatic discharge (ESD) current during an ESD event from the first supply voltage node to the second supply voltage node, wherein the means has a holding voltage that is greater than fifteen volts, and wherein the means has a trigger voltage that is less than twenty percent higher than the holding voltage.

17. The integrated circuit of claim 16, further comprising:
functional circuitry that is protected from the ESD event by the means, wherein the functional circuitry is powered from the first supply voltage node, and wherein a supply voltage of greater than fifteen volts is present between the first supply voltage node and the second supply voltage node during normal operation of the functional circuitry.

18. The integrated circuit of claim 16, wherein the first supply voltage node is coupled to a first terminal of the integrated circuit, and wherein the second supply voltage node is coupled to a second terminal of the integrated circuit.

19. The integrated circuit of claim 16, wherein the means is a stacked gate-coupled N-channel field effect transistor (GC-NFET) electrostatic discharge (ESD) protection circuit.

20. The integrated circuit of claim 19, wherein the means for shunting comprises:
 means for conducting a first current from the first supply voltage node, and through a first resistor such that a gate-to-source voltage of a first N-channel field effect transistor (NFET) is increased during the ESD event thereby initiating snap-back of a first stage, wherein the first stage includes the first NFET; and
 means for conducting a second current from the first supply voltage node, and through a second resistor such that a gate-to-source voltage of a second NFET is increased during the ESD event thereby initiating snap-back of a second stage, wherein the second stage includes the second NFET, wherein the first and second stages are stages of the stacked gate-coupled N-channel field effect transistor (GCNFET) electrostatic discharge (ESD) protection circuit.

* * * * *